United States Patent
Hopper (10) Patent No.: US 10,461,071 B2
(45) Date of Patent: Oct. 29, 2019

(54) ELECTROSTATIC DISCHARGE PROTECTION OF AN INTEGRATED CIRCUIT CLOCK

(71) Applicant: NXP B.V., Eindhoven (NL)

(72) Inventor: Alastair Hopper, Seiersberg (AT)

(73) Assignee: NXP B.V., Eindhoven (NL)

( * ) Notice: Subject to any disclaimer, the term of this patent is extended or adjusted under 35 U.S.C. 154(b) by 272 days.

(21) Appl. No.: 15/424,206

(22) Filed: Feb. 3, 2017

(65) Prior Publication Data
US 2018/0226393 A1   Aug. 9, 2018

(51) Int. Cl.
| | |
|---|---|
| *H01L 27/02* | (2006.01) |
| *H03B 5/12* | (2006.01) |
| *H03B 5/36* | (2006.01) |

(52) U.S. Cl.
CPC ......... *H01L 27/0255* (2013.01); *H03B 5/124* (2013.01); *H03B 5/1234* (2013.01); *H03B 5/36* (2013.01); *H03B 2201/0208* (2013.01); *H03B 2201/038* (2013.01)

(58) Field of Classification Search
CPC ... H01L 27/0255; H03B 5/124; H03B 5/1234; H03B 5/36; H03B 2201/0208; H03B 2201/038
USPC .......................... 331/175, 185, 183; 361/212
See application file for complete search history.

(56) References Cited

U.S. PATENT DOCUMENTS

| | | | |
|---|---|---|---|
| 6,064,277 A | 5/2000 | Gilbert | |
| 7,477,495 B2 | 1/2009 | Dornbusch | |
| 7,948,329 B2 * | 5/2011 | Lim | ............ H03K 3/3545 331/160 |
| 2003/0164035 A1 | 9/2003 | Nantz et al. | |
| 2008/0090530 A1 | 4/2008 | Huang | |
| 2009/0278612 A1 | 11/2009 | Lim | |
| 2010/0214029 A1 | 8/2010 | McDonald et al. | |
| 2011/0234331 A1 | 9/2011 | Ding et al. | |
| 2017/0023957 A1 * | 1/2017 | Bossu | ............ H01L 27/0251 |

OTHER PUBLICATIONS

Jim Williams, "Circuit Techniques for Clock Sources," Linear Technology, Application Note 12, Oct. 1985.
Analog Devices, Circuit Note, CN0147.
(Continued)

*Primary Examiner* — Arnold M Kinkead (57) ABSTRACT

Certain aspects of the disclosure are directed to electrostatic discharge protection of an integrated circuit clock. According to a specific example, circuitry includes a direct-current power supply, a voltage-controlled oscillation (VCO) circuit, an electrostatic protection circuit, and a voltage regulator. The VCO circuit has an oscillation frequency and includes an amplification circuit and capacitance circuitry. The electrostatic protection circuit is arranged to connect power to the VCO circuit while reducing variation in the oscillation frequency of the VCO circuit resulting from electrostatic energy. The voltage regulator is connected between the direct-current power supply and a power supply connection at which the direct-current power is connected to the VCO, and is configured to mitigate an imbalance of electric charges from adversely altering a tuning capacitance of the VCO established by the capacitance circuitry.

15 Claims, 5 Drawing Sheets

(56) References Cited

OTHER PUBLICATIONS

Vivekananth Gurumoorthy et al., "Supply Regulation Techniques for Phase-Locked Loops," Dept of Electrical & Computer Enginnering, Texas A&M University.
Extended European Search Report for Patent Appln. No. 18153003.1 (dated Nov. 30, 2018).

* cited by examiner

ELECTROSTATIC DISCHARGE PROTECTION OF AN INTEGRATED CIRCUIT CLOCK

OVERVIEW

Aspects of various embodiments are directed to electrostatic discharge protection of on-chip clock control mechanisms. Many computing systems require some form of clock source. Generating accurate and stable clock signals is often a difficult design problem. Clock signals may be generated using an electronic oscillator circuit that uses a piezoelectric resonator as its frequency-determining element. An electronic oscillator circuit can be manufactured for oscillation over a wide range of frequencies. Many applications call for an oscillator frequency over a particular frequency, and some applications may be more sensitive to variations in the oscillator frequency than others.

Integrated circuit architectures require analog circuit blocks to maintain high-performance in environments with large amounts of digital switching noise. While phase-locked-loops (PLL) which employ voltage-controlled oscillators (VCOs) with full-swing field effect transistor delay elements are attractive due to their fast switching, design simplicity, and portability, these architectures are sensitive to supply-noise which induces jitter on the PLL output clocks.

These and other matters have presented challenges to efficiencies of electrostatic discharge protection of on-chip clock regulation, for a variety of applications.

SUMMARY

Various example embodiments are directed to issues such as those addressed above and/or others which may become apparent from the following disclosure concerning efficiencies of electrostatic discharge protection for on-chip clock regulation. The example embodiments described herein are directed to circuits with voltage-controlled oscillation circuitry that mitigates noise on high-performance clock output devices, particularly beneficial to and enhancing applications that are highly sensitive to variations in clock frequency.

In certain example embodiments, aspects of the present disclosure involve mitigating the effects of an imbalance of electrical charges on a tuning capacitance of a voltage-controlled oscillator in an integrated circuit. As described herein, a capacitance circuit may tune the electronic oscillator on an integrated circuit, but the electronic oscillator may also be inadvertently affected by nearby components such as electrostatic discharge (ESD) protection structures. Electronic oscillators generally refer to an electronic circuit that produces a periodic, oscillating electronic signal, often a sine wave or a square wave. Examples of electronic oscillators may include crystal oscillators, LC oscillator circuits, and RC oscillator circuits, among others. Aspects of the present disclosure allow various ESD protection structures to be applied to an oscillator circuit while avoiding the negative impacts of parasitic capacitance, which may be particularly useful in battery operated devices.

In a more specific example embodiment, an apparatus may be provided including a direct-current (DC) power supply, as well as a voltage-controlled oscillating (VCO) circuit having an oscillation frequency. The VCO circuit includes an amplification circuit having a power amplifier, and capacitance circuitry collectively configured to tune the oscillation frequency of the electronic oscillator. The apparatus may also include an electrostatic protection circuit arranged to connect power to the VCO circuit while reducing variation in the oscillation frequency of the VCO. Moreover, the apparatus may include a voltage regulator that is configured to mitigate an imbalance of electric charges from adversely altering a tuning capacitance of the VCO established by the capacitance circuitry.

In other specific example embodiments, methods are directed to supplying DC power to an integrated circuit by providing a VCO signal having an oscillation frequency, where the VCO oscillation frequency is controlled by capacitance circuitry connected to an amplification circuit. Power may be connected to the VCO signal using a circuit that also mitigates adverse effects of electrostatic energy on the oscillation frequency. Thereby, the effects of an imbalance of electric charges on a tuning capacitance of the VCO signal may be mitigated by regulating the supplied DC power and by providing a regulated supply voltage at a power supply node for powering the VCO signal.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving ESD protection circuitry. In certain implementations, aspects of the present disclosure have been shown to be beneficial when used in the context of ESD protection for integrated circuit (IC) chips where clock speed regulation is an important consideration, such as narrow band radio frequency systems. While not necessarily so limited, various aspects may be appreciated through the following discussion of non-limiting examples and the corresponding contexts.

In accordance with the present disclosure, a VCO circuit of an integrated circuit may be connected to a regulated power supply such that electrostatic discharge protection is provided to the electronic oscillator. The VCO circuit may also be connected directly to a direct current (DC) power supply. The power supply of the electronic oscillator may be selected independently from the rest of the integrated circuit such that the electronic oscillator can be directly connected to the DC power supply for applications not requiring a high level of frequency stability. Conversely, for applications that require a high level of frequency stability, the electronic oscillator can be connected to the DC power supply and a regulated power supply to mitigate a change in the oscillation frequency of the electronic oscillator. This allows for improved performance, particularly for narrow band radio frequency systems powered by a small coin cell battery and systems where a stable oscillation frequency is needed (such as, in ultra wideband reception systems where a variation in oscillation frequency of less than 15 ppm is required).

In certain implementations, aspects of the present disclosure have been shown to be beneficial when used in the context of ultrahigh frequency (UHF) systems and/or ultra wideband radio frequency systems supplied by a coin cell battery. Aspects of the disclosure have been shown to be beneficial for use in small, programmable hardware devices associated with motor vehicles, such as key fobs, which in turn transmit a voltage controlled signal to a remotely located receiver such as would be located near the ignition of an automobile. Key fobs, which may also be referred to as hardware tokens, can be used to provide on-device, one-factor authentication to objects such as doors or automobiles. They can also be used as an authentication factor for objects that require two-factor or multifactor authentication, such as laptops. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Related aspects of the present disclosure are directed to an apparatus for electrostatic discharge protection of on-chip clock regulation. The apparatus may comprise a DC power supply, such as a coin cell battery, as well as a VCO circuit having a particular oscillation frequency. The VCO circuit may include an amplification circuit and capacitance circuitry. The apparatus may further include an electrostatic protection circuit arranged to connect power to the VCO circuit while reducing variation in the oscillation frequency of the VCO circuit resulting from electrostatic energy, and/or damage to the integrated circuit itself resulting from the electrostatic energy. A voltage regulator may be connected between the DC power supply and a power supply connection at which the DC power is connected to the VCO. The voltage regulator may be configured to mitigate an imbalance of electric charges from adversely altering a tuning capacitance of the VCO established by the capacitance circuitry. The voltage regulator may be configured and arranged to provide a power supply to the VCO at a voltage less than the voltage of the DC power supply, such that a relatively constant voltage (e.g., less than a threshold variation) input is provided to the VCO despite a change in the voltage provided by the DC power supply. Examples of such regulator may include low drop-out regulators or other devices configured to regulate an output voltage that is powered from a higher voltage input. While an LDO regulator is provided herein as an example of a voltage regulator, examples are not so limited, and the apparatus may include other types of voltage regulators configured and arranged to provide a stable power supply to the VCO circuit at a particular voltage level.

In some examples, the apparatus may comprise an integrated chip having a VCO circuit. The electronic oscillator of the VCO circuit may be tuned by a capacitance circuitry, such that the electronic oscillator oscillates at a particular frequency. The integrated circuit may be partitioned such that the electronic oscillator is electrically isolated from the electrostatic protection circuit. By isolating the electronic oscillator from the electrostatic protection circuit, the supply of the electronic oscillator may be chosen independently from the rest of the integrated circuit. Accordingly, as applicable to some specific embodiments, the apparatus may be configured and arranged to resolve conflicts between the different logic voltage levels, such as with level shifters.

As discussed herein, references to "electrostatic discharge" concerns the sudden flow of electricity between two electrically charged objects such as caused by contact, an electrical short, or dielectric breakdown. Addressing this issue properly is particularly beneficial for integrated circuits closely situated as on a single piece of semiconductor material, such as silicon. The integration of large numbers of tiny transistors into a small chip results in circuits that are orders of magnitude smaller, cheaper, and faster than those constructed of discrete electronic components. Integrated circuits are designed for low voltage applications, but the transmission of signals from the devices employing them may cause an increase of current from the power-supply source (e.g., battery) of the integrated circuit. Such circuits often use a battery with a limited current capability and a related high output resistance can cause the voltage of the battery to drop when current is drawn. The drop of the voltage in turn causes ESD protection structures to vary their internal capacitance. The electronic oscillator of the integrated circuit may be sensitive to the variation of the capacitance of the ESD protection structures, which causes the frequency of the electronic oscillator to vary. This variation may be in the range of PPM (part per million) but may nonetheless exceed an acceptable frequency range for a particular application executed by the device.

Often, electrostatic discharge (ESD) protection structures are connected together with the rest of the components of an integrated circuit to the internal power busses of the device. However, ESD protection structures have a large variation of capacitance with voltage and hence electronic oscillators may be influenced by the variation of the voltage on the ESD protection structures, which causes a voltage dependent frequency shift. In battery operated systems, the variation of the battery voltage may be larger than fixed powered solutions, hence the voltage regulation of the circuit may be poor and variation of the voltage can be expected, particularly during transmission. Aspects of the present disclosure mitigate the voltage dependent frequency shift resulting from ESD and/or a change in the voltage of the power-supply. Certain embodiments are directed to an apparatus including a voltage regulator that provides power to the electronic oscillator at a voltage less than the voltage provided by the DC power supply.

Electrostatic discharge protection circuits refer generally to circuitry that protect various components of a circuit from damage resulting from electrostatic discharge. Aspects of the present disclosure include an electrostatic protection circuit having a plurality of p-n junction diodes. The p-n junction diodes may be connected between a voltage regulator and the VCO circuit, and the VCO circuit may include a feedback loop. The feedback loop of the VCO circuit allows for an output signal to be fed back to an amplification circuit in such a way that the feedback signal is regenerated, re-amplified and fed back again to maintain a constant output signal. The electrostatic discharge protection circuit may protect the VCO circuit and other components of the integrated circuit from damage resulting from electrostatic discharge. However, with varying voltages from the DC power supply connected to the VCO circuit such as a coin cell battery or equivalent voltage supply where the internal resistance is high (e.g., greater than 1 Ohm), the p-n junction diodes of the electrostatic protection circuit may become varicaps. The VCO circuit may also include a plurality of capacitors configured and arranged to tune the oscillation frequency of the electronic oscillator. A change in operation of the p-n junction diodes and a change in capacitors coupled to the electronic oscillator may result in a change in oscillation frequency of the electronic oscillator, and/or in damage to the integrated circuit itself.

Aspects of the present disclosure include a VCO circuit having an electronic oscillator tuned by the capacitance circuitry to oscillate at the oscillation frequency. A voltage regulator is connected to the VCO circuit and configured and arranged to mitigate a change in capacitance of the capacitance circuitry in response to a change in the voltage provided by the DC power supply. The voltage regulator may provide an additional power supply to the VCO circuit at a voltage less than the voltage provided by the DC power supply, based on a change in the voltage provided by the DC power supply greater than a threshold voltage range for a particular application executed by the apparatus. In such a manner, a relatively constant voltage may be applied to the electronic oscillator, allowing for narrow band radio frequencies to be transmitted by the integrated circuit.

In another example, an apparatus is provided for electrostatic discharge protection of an integrated circuit clock. The apparatus may include means for supplying DC power to the integrated circuit, as well as a VCO means. The VCO means may provide a voltage-controlled oscillating signal having an oscillation frequency and including an amplification circuit and capacitance circuitry. As described herein, the VCO means may include a feedback loop to further maintain the oscillation frequency. The apparatus may further include means for connecting power to the VCO means using a circuit that mitigates electrostatic energy from adversely affecting the oscillation frequency and/or from damaging the integrated circuit itself. Moreover, the apparatus may include voltage regulation means connected between the means for supplying DC power and a power supply connection at which the power is connected to the VCO means.

The voltage regulation means may be configured to mitigate an imbalance of electric charges from adversely altering a tuning capacitance of the VCO means, where the tuning capacitance is established by the capacitance circuitry. As described herein, the apparatus may include means to selectively activate the voltage regulation means dependent upon an application to be executed by the integrated circuit. For instance, the electronic oscillator can be directly connected to the DC power supply for applications that operate within a range of frequencies that are above a threshold voltage range, and connected to the DC power supply as well as a regulated power supply for applications that operate within a range of frequencies that are below the threshold voltage range (e.g., less than 15 ppm variability in frequency variation). Because the electronic oscillator may receive power from different sources (i.e., the DC power supply or the DC power supply and the voltage regulator), the apparatus may include means to resolve mixed voltage signals received from the voltage regulation means and the DC power means. For instance, the DC power supply may use a first logic standard whereas the voltage regulation means may use a second logic standard. The apparatus may include means to resolve the conflict between the first logic standard and the second logic standard, such as by level shifters or by other means.

Examples of the present disclosure protect the electronic oscillator (e.g., a crystal oscillator) from variation in voltage. While the frequency variation of electronic oscillators may be in the parts per million (ppm) range, particularly with coin cell battery systems, the frequency of the oscillator may be important for proper operation of the respective integrated circuit. By maintaining a steady frequency of the oscillator, improved timing precision of radio frequency signals and improved effects of the electrostatic discharge protection systems may be achieved.

Figure 1:
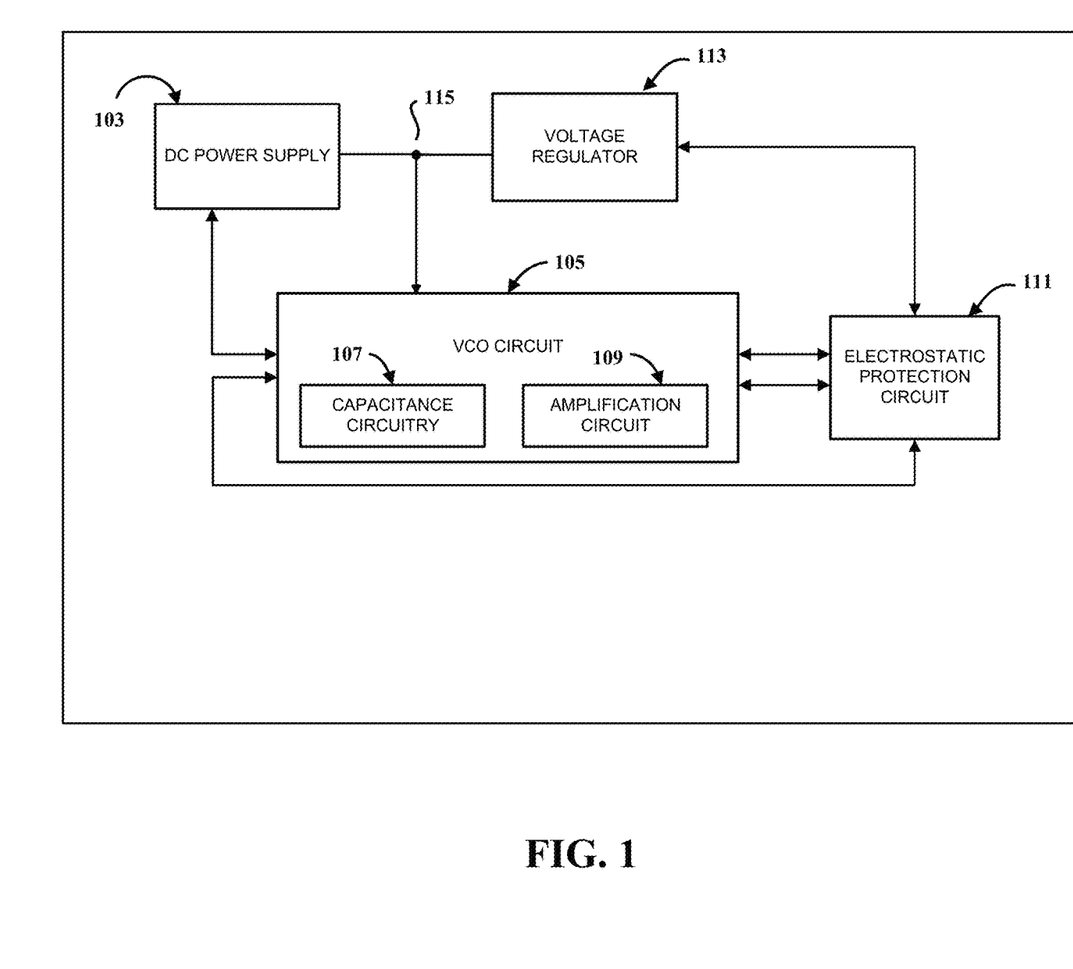
FIG. 1 is a system-level diagram illustrating an electrostatic discharge protection system, in accordance with the present disclosure.

Turning now to the figures, FIG. 1 is a block diagram of an apparatus for electrostatic discharge protection of an integrated circuit clock, consistent with embodiments of the present disclosure. The apparatus includes a direct-current (DC) power supply 103, such as a coin cell battery or equivalent voltage supply with a high internal resistance (e.g., greater than 1 Ohm). The apparatus further includes a VCO circuit 105. As described herein, the VCO circuit 105 may have an oscillation frequency that is set and maintained (e.g., tuned) by the capacitance circuitry 107. Moreover, the VCO circuit 105 may include an amplification circuit 109. Put another way, the VCO circuit 105 includes an electronic oscillator such as a crystal oscillator, which is tuned by the capacitance circuitry 107 to oscillate at a particular oscillation frequency. The capacitance circuitry 107 and amplification circuit 109 may be part of a phase locked loop as illustrated in subsequent figures herein.

Examples of the present disclosure further include an electrostatic protection circuit 111 that connects power to the VCO circuit 105 while also reducing variation in the oscillation frequency of the VCO circuit 105 resulting from electrostatic energy. Similarly, aspects of the present disclosure include a voltage regulator 113. As described herein, the voltage regulator is connected between the DC power supply 103 and a power supply connection (e.g., a node) 115 at which the DC power is connected to the VCO circuit 105. The voltage regulator 113 may be configured to mitigate an imbalance of electric charges from adversely altering a tuning capacitance of the VCO circuit 105 that is established by the capacitance circuitry 107.

In some examples, the direct-current power supply 103 is a coin cell battery or other high resistance voltage supply, and the voltage regulator 113 is a low drop out (LDO) regulator configured and arranged to provide a power supply to the VCO circuit 105 at a voltage less than the voltage of the direct-current power supply 103 (e.g., the coin cell battery).

Figure 2:
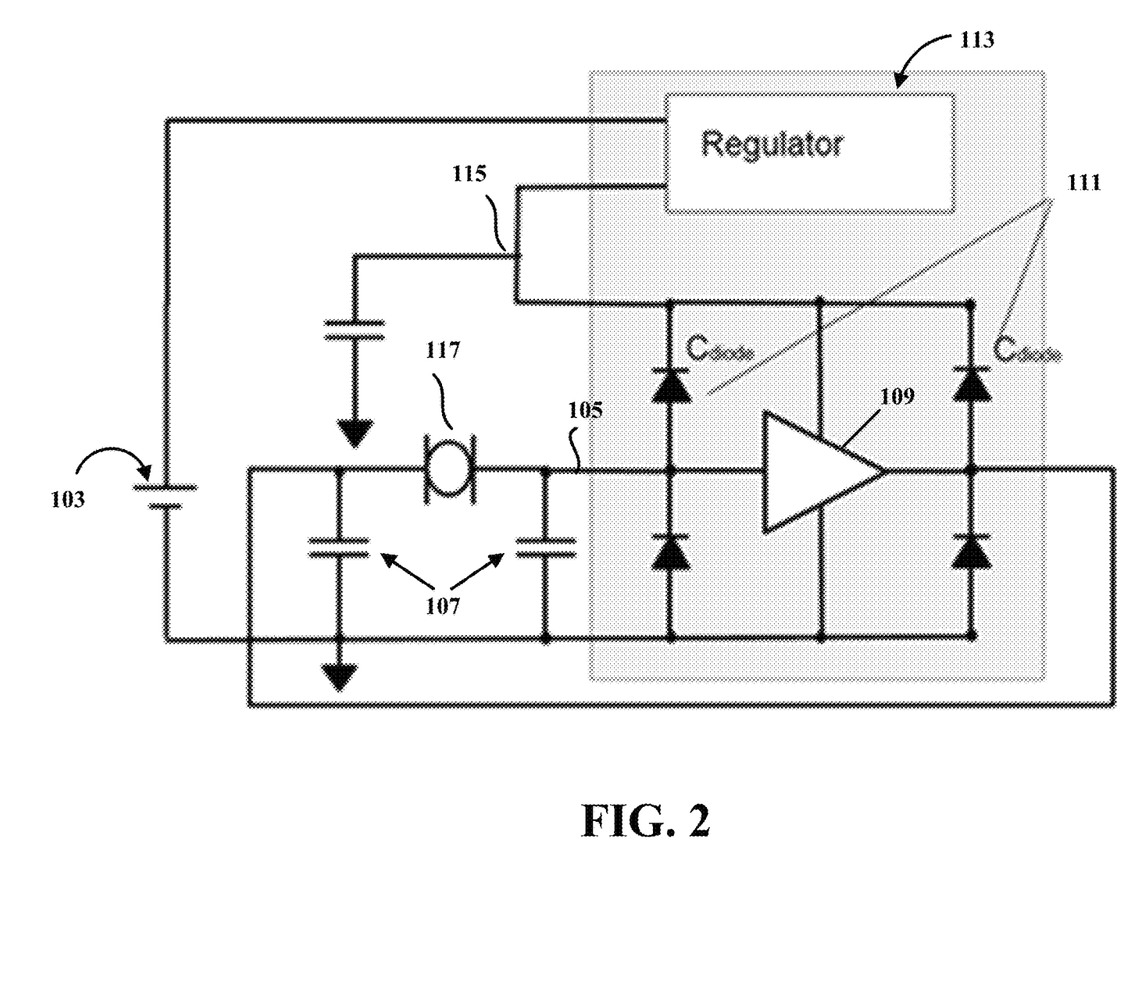
FIG. 2 is a further system-level diagram illustrating an electrostatic discharge protection system, in accordance with the present disclosure.

FIG. 2 illustrates a more detailed block diagram of an apparatus for electrostatic discharge protection of an integrated circuit clock, in accordance with the present disclosure. As illustrated in FIG. 2, the electrostatic protection circuit 111 may include a plurality of p-n junction diodes, each of which is connected between the voltage regulator 113 and the VCO circuit 105. These diodes may be equivalent to a capacitance. The VCO circuit 105 includes a plurality of capacitors 107 which may collectively form the capacitance circuitry. To maintain a relatively constant output signal for the integrated circuit, the VCO circuit 105 may be connected with the amplification circuit 109 the capacitance circuitry (e.g., capacitors 107), and the diodes (e.g., the diodes of the electrostatic protection circuitry 111) in a feedback loop, as illustrated.

Certain aspects of the present disclosure include an electronic oscillator 117 tuned by the capacitance circuitry 107 to oscillate at a particular oscillation frequency. The voltage regulator 113, when connected to the VCO circuit 105, is configured and arranged to mitigate a change in capacitance of the capacitance circuitry 107 in response to a change in the voltage provided by the direct-current power supply 103. To mitigate the change in capacitance, the voltage regulator 113 may be configured to provide an additional power supply to the VCO circuit 105 at a voltage less than the voltage provided by the direct-current power supply 103. Also, as illustrated, the voltage regulator 113 and the electrostatic protection circuit 111 may be connected to a low-bias voltage, such as ground.

In other words, the capacitors that collectively form the capacitance circuitry 107 may tune the oscillator 117 of the VCO circuit 105. The capacitors may be affected by changes in the frequency of the DC power supply 103. To mitigate the effects of the change in frequency of the DC power supply 103 on the VCO circuit 105 (and on the integrated circuit generally), an inverter (e.g., amplification circuit 109) may be powered from a "clean" power supply such as an LDO regulator (e.g., voltage regulator 113), though any type of regulator may be used. Moreover, ESD protection diodes (e.g., comprising electrostatic protection circuit 111) or "protection structures" may be connected to voltage rails. Any variation of the supply voltage between the voltage rails may affect the performance of the oscillator 117.

As illustrated further herein, unexpected results were received using the apparatus illustrated in FIG. 1 and FIG. 2, particularly, with regard to UHF systems and ultra-wideband systems. UHF systems transmit communications at a frequency in the range of 300 megahertz (MHz) to 3 gigahertz (GHz) and having wavelengths from one meter to one decimeter and ultra-wideband systems transmitting communications over a 500 MHz frequency. UHF and/or ultra-wideband technology may be used in time-of-flight (TOF) systems employing a pulse-echo architecture where a receiver locks on to received signals and determines the location of the transmitting device based on the received signals. In such examples, if the transmitter changes frequency due to electrostatic discharge or simply due to variation in voltage supplied by the DC power supply, the receiving device may be incapable of determining the location of the transmitting device. However, by mitigating noise that may affect the oscillation frequency of the on-chip clock in transmitting device, such high-performance clocks may consistently transmit communications in narrow band radio frequency systems.

Figure 3:
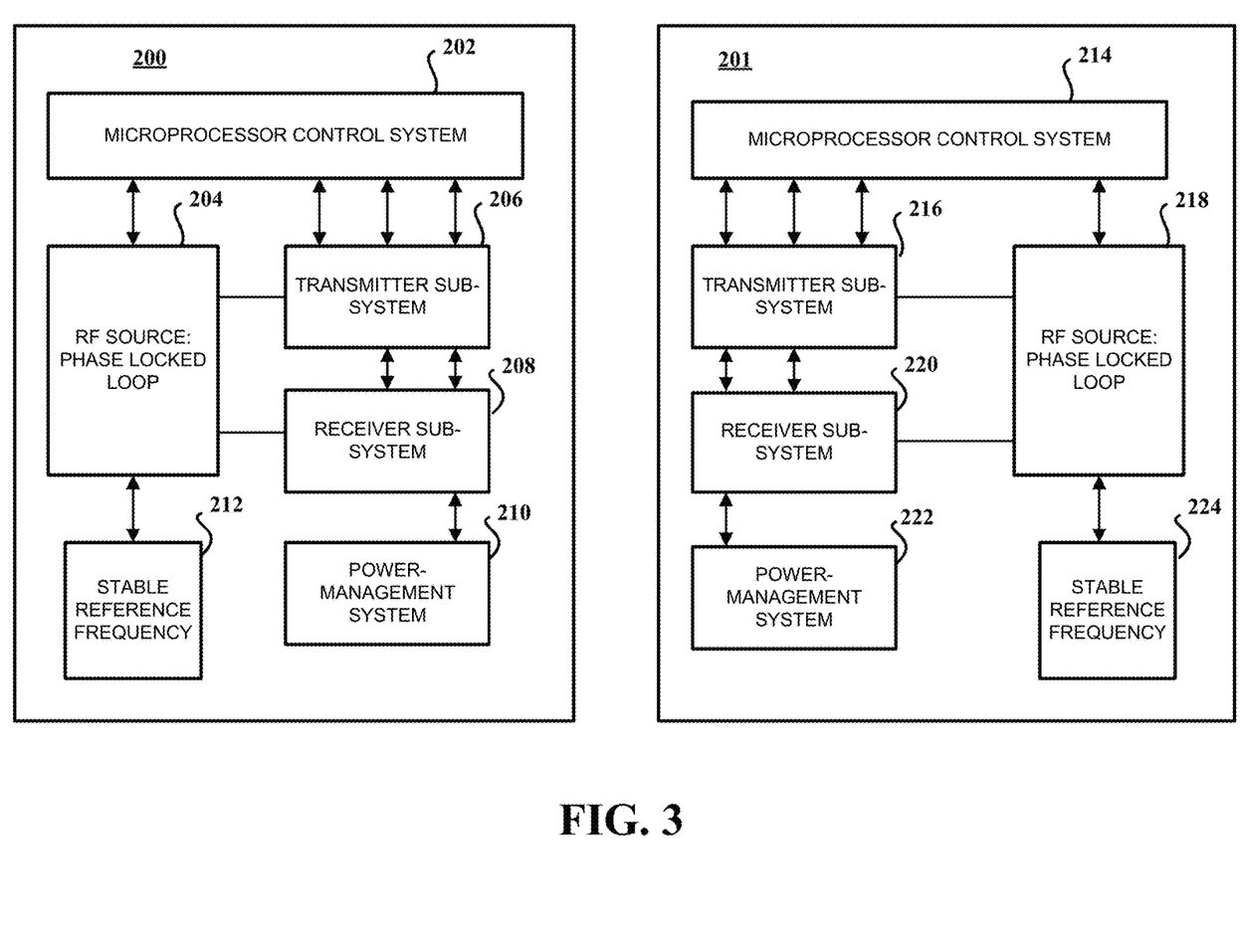
FIG. 3 is a block diagram illustrating a system including means for electrostatic discharge protection of an integrated circuit clock, in accordance with the present disclosure.

FIG. 3 is a block diagram illustrating a system including means for electrostatic discharge protection of an integrated circuit clock, in accordance with the present disclosure. Two or more radio frequency devices (e.g., 200 and 201) may transmit communications to one another at a particular frequency. For example, device 200 may be an automobile key for configured and arranged to communicate with a receiver 201 on a particular vehicle. Each of the devices 200 and 201 include an integrated circuit having a number of components. For instance, each of devices 200 and 201 may include a microprocessor control system (202 and 214, respectively), a transmitter sub-system (206 and 216, respectively), as well as a receiver sub-system (208 and 220, respectively). Similarly, each of the devices 200 and 201 may include a power management system (210 and 222, respectively) as well as a stable reference frequency (212 and 224, respectively).

In accordance with the present disclosure, each of devices 200 and 201 may also include a radio frequency (RF) source that includes a phase locked loop (204 and 218), respectively. The RF sources may include the apparatus illustrated in FIG. 1 and FIG. 2. Put another way, each of the RF source 204 and the RF source 218 may include a VCO circuit, an electrostatic protection circuit, a DC power supply, and a voltage regulator, among other components. As such, each of devices 200 and 201 may include means for supplying direct-current power to an integrated circuit. As described in reference to FIG. 1 and FIG. 2, each of devices 200 and 201 may include voltage-controlled oscillation (VCO) means for providing a voltage-controlled oscillating signal that has a particular oscillation frequency and which includes an amplification circuit and a capacitance circuitry. Moreover, each of devices 200 and 201 may include means for connecting power to the VCO means using a circuit that also mitigates electrostatic energy from adversely affecting the oscillation frequency. Similarly, voltage regulation means may be connected between the means for supplying direct-current power and a power supply connection at which the power is connected to the VCO means, as illustrated in FIG. 2. The voltage regulation means may be configured to mitigate an imbalance of electric charges from adversely altering a tuning capacitance of the VCO means, where the tuning capacitance established by the capacitance circuitry. To mitigate the effect of electric charges on the tuning capacitance of the VCO means, the voltage regulation means may be are configured and arranged to supply another power supply (in addition to the DC power supply) to the VCO means at a voltage less than a voltage of the direct-current power supply means. The voltage regulation means may selectively power the VCO means, such that the voltage regulation means and the DC power supply means power the VCO means for applications requiring a frequency stability less than a particular threshold (such as 15 ppm), and the voltage regulation means may alone power the VCO means for applications that do not require a frequency stability less than the threshold (e.g., above 15 ppm). In such a manner, the power source for the VCO means of each device may be dependent upon an application to be executed by the integrated circuit.

Figure 4:
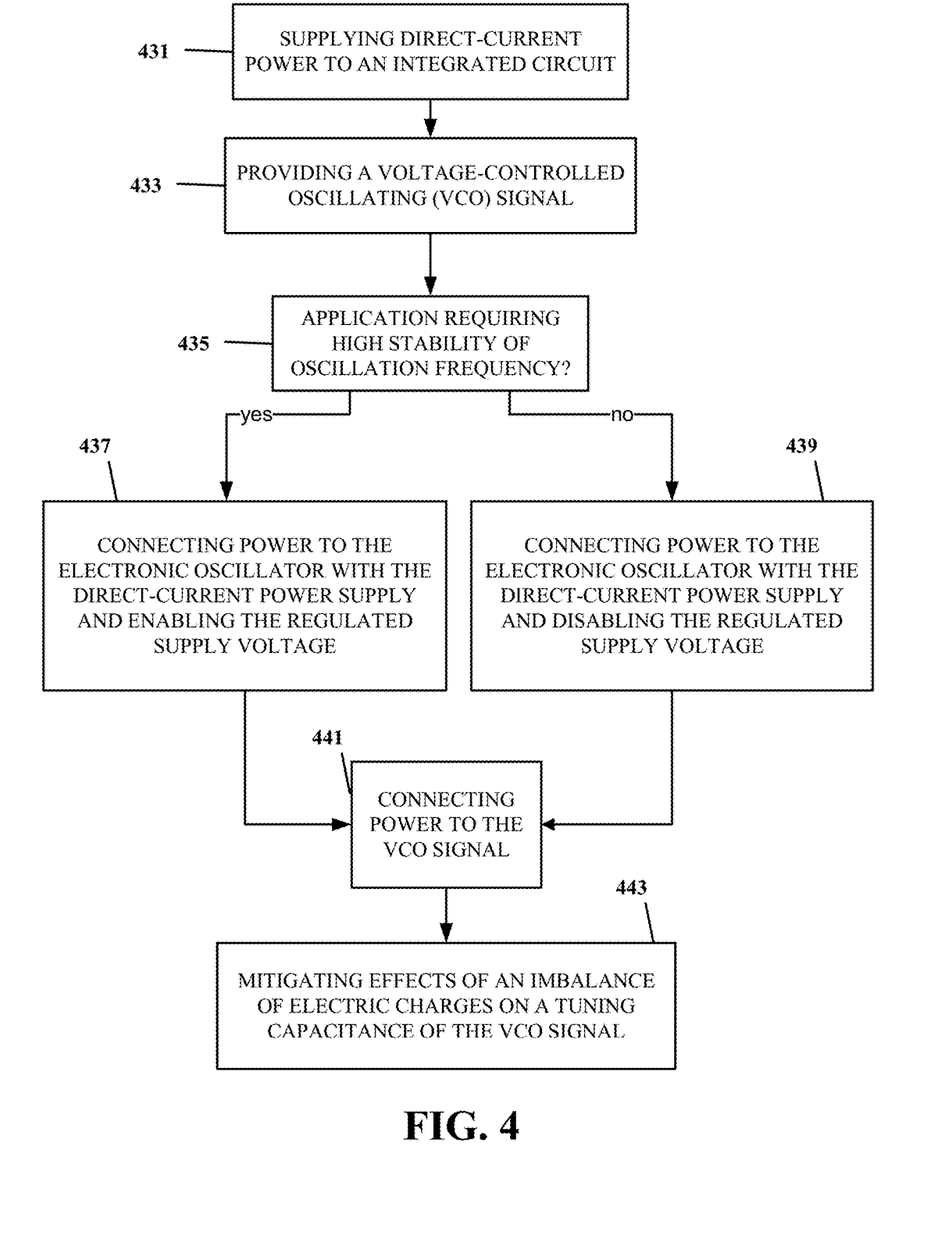
FIG. 4 is a flow chart illustrating an exemplary set of activities and/or data flow for a system of the type implemented in a manner consistent with FIG. 1, in accordance with the present disclosure.

FIG. 4 is a flowchart illustrating an exemplary set of activities and/or data flow for a system of the type implemented in a manner consistent with FIG. 1, in accordance with the present disclosure. At 431, the method includes providing a VCO signal having an oscillation frequency influenced by capacitance circuitry connected to an amplification circuit. At 433, the method includes providing a VCO signal, such as connecting power to the VCO signal using a circuit that also mitigates adverse effects of electrostatic energy on the oscillation frequency. At 435, the method includes determining if an application performed by the integrated circuit requires a high stability of oscillation frequency. For instance, for applications requiring a phase shift performance below a particular threshold (e.g., "yes"), the method includes connecting power to the electronic oscillator with the DC power supply and enabling a regulated supply voltage at 437. In such examples, the voltage regulator illustrated in FIG. 1 and FIG. 2 may provide additional power to the VCO circuit at a voltage lower than the power provided by the DC power supply. For applications that do not require a phase shift performance below a particular threshold (e.g., "no"), the method includes connecting the power to the electronic oscillator with the DC power supply and disabling the regulated supply voltage at 439. In such a manner, the power supply for the VCO circuit (and therefore the electronic oscillator) may be selectively applied based on the application used by the integrated circuit. At 441, the method includes connecting power to the VCO signal, either via the DC power supply or the DC power supply and the voltage regulator. Therefore, at 443, the method includes mitigating effects of an imbalance of electric charges on a tuning capacitance of the VCO signal established by the capacitance circuitry by regulating the supplied direct-current power and providing a regulated supply voltage at a power supply node for powering the VCO signal.

Figure 5:
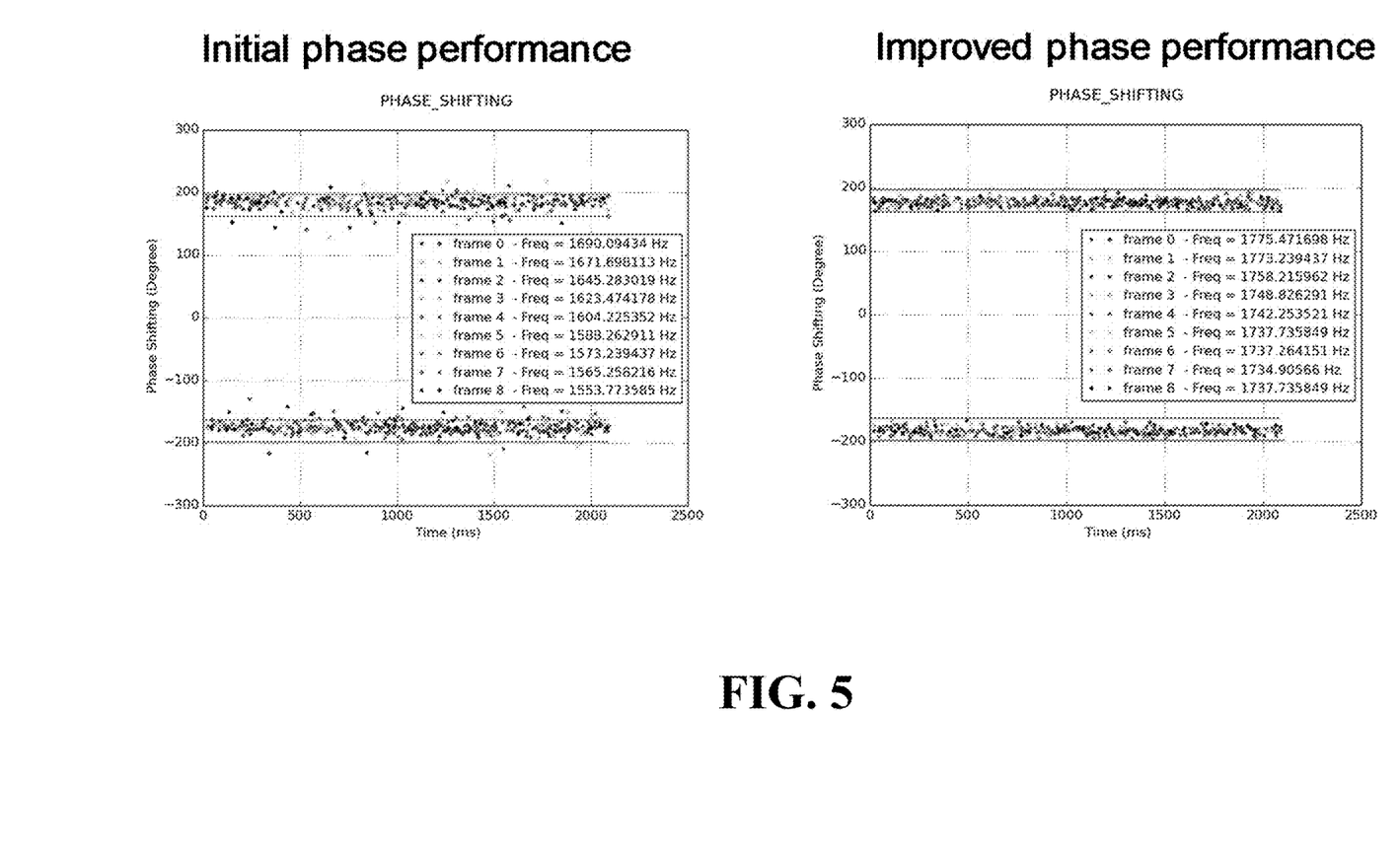
FIG. 5 is a diagram illustrating unexpected results achieved using the system of the type implemented in FIG. 1, in accordance with the present disclosure.

FIG. 5 is a diagram illustrating unexpected results achieved using the system of the type implemented in FIG. 1, in accordance with the present disclosure. As seen on the left side of the diagram, initial phase performance indicated that the frequency range for various transmission frequencies varied greatly in degree. A review of such data led to the unexpected discovery that the amount of noise on a clock input effected the degree to which the clocks may consistently output a narrow band frequency signal. This discovery was confirmed by implementing the electrostatic discharge protection method and systems described herein. As illustrated on the right side of the diagram, data confirmed the unexpected discovery that by providing an additional power supply to the VCO circuit, a stable input voltage may be provided to the VCO circuit despite changes in the voltage provided by the DC power supply, the effects of electrostatic discharge on the oscillation frequency may be mitigated and the VCO circuit may maintain a more consistent transmission frequency with a smaller degree of phase shifting.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions. Such circuits or circuitry are used together with other elements to exemplify how certain embodiments may be carried out in the form or structures, steps, functions, operations, activities, etc. For example, in certain of the above-discussed embodiments, one or more illustrated items in this context represent circuits (e.g., discrete logic circuitry or (semi-)programmable circuits) configured and arranged for implementing these operations/activities, as may be carried out in the approaches shown in FIGS. 1, 2, and 3. The specification may also make reference to an adjective that does not connote any attribute of the structure ("first [type of structure]" and "second [type of structure]") in which case the adjective is merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the flow chart illustrated in FIG. 4 may involve more or fewer steps. As another example, the systems illustrated in FIG. 1, FIG. 2, and FIG. 3 may include more or fewer aspects thank illustrated. Such modifications do not depart from the true spirit and scope of various aspects of the disclosure, including aspects set forth in the claims.

What is claimed is:

1. An apparatus comprising:
a direct-current power supply;
a voltage-controlled oscillation (VCO) circuit having an oscillation frequency and including an amplification circuit and capacitance circuitry;
an electrostatic protection circuit arranged to connect power to the VCO circuit while reducing variation in the oscillation frequency of the VCO circuit resulting from electrostatic energy; and
a voltage regulator connected between the direct-current power supply and a power supply connection at which the direct-current power is connected to the VCO, the voltage regulator configured to mitigate an imbalance of electric charges from adversely altering a tuning capacitance of the VCO established by the capacitance circuitry, wherein the apparatus is an integrated chip and the VCO circuit includes an electronic oscillator tuned by the capacitance circuitry to oscillate at the oscillation frequency, wherein the electronic oscillator is electrically isolated from the electrostatic protection circuit.

2. The apparatus of claim 1, wherein the voltage regulator includes a low drop out regulator configured and arranged to provide a power supply to the VCO at a voltage less than the voltage of the direct-current power supply.

3. The apparatus of claim 2, wherein the direct-current power supply includes a coin cell battery.

4. The apparatus of claim 1, wherein the electrostatic protection circuit and the voltage regulator are connected to a low-bias voltage.

5. The apparatus of claim 1, wherein the electrostatic protection circuit includes a plurality p-n junction diodes, the p-n junction diodes connected between the voltage regulator and the VCO circuit.

6. The apparatus of claim 5, wherein the VCO circuit includes a feedback loop connecting the amplification circuit, the capacitance circuitry, and the diodes.

7. The apparatus of claim 1, wherein the VCO circuit includes an electronic oscillator tuned by the capacitance circuitry to oscillate at the oscillation frequency, and wherein the voltage regulator is configured and arranged to mitigate a change in capacitance of the capacitance circuitry in response to a change in the voltage provided by the direct-current power supply.

8. The apparatus of claim 7, wherein the voltage regulator is configured to provide an additional power supply to the VCO circuit at a voltage less than the voltage provided by the direct-current power supply, such that a relatively constant voltage input is provided to the VCO despite a change in the voltage provided by the direct-current power supply.

9. An apparatus comprising:
a power source for supplying direct-current power to an integrated circuit;
voltage-controlled oscillation (VCO) circuit for providing a voltage-controlled oscillating signal having an oscillation frequency and including an amplification circuit and capacitance circuitry;
a circuit for connecting power to the VCO circuit and for mitigating electrostatic energy from damaging the integrated circuit; and
voltage regulation circuitry connected between the power source and a power supply connection at which the power is connected to the VCO circuit, and configured to mitigate an imbalance of electric charges from adversely altering a tuning capacitance of the VCO circuit, the tuning capacitance established by the capacitance circuitry, wherein the VCO circuit includes circuitry to resolve mixed voltage signals received from the voltage regulation circuitry and the power source.

10. The apparatus of claim 9, wherein the voltage regulation circuitry are configured and arranged to supply another power supply to the VCO circuit-at a voltage less than a voltage of the power source.

11. The apparatus of claim 9, including circuitry to selectively activate the voltage regulation circuitry dependent upon an application to be executed by the integrated circuit.

12. The apparatus of claim 9, wherein the power source uses a first logic voltage level and the voltage regulation circuitry uses a second logic voltage level, the circuitry configured to resolve conflicts being to resolve conflicts being configured to resolve conflicts between the first logic voltage level and the second logic voltage level.

13. A method comprising:
supplying direct-current power to an integrated circuit;
providing a voltage-controlled oscillating (VCO) signal having an oscillation frequency influenced by capacitance circuitry connected to an amplification circuit;
connecting power to the VCO signal using a circuit that also mitigates adverse effects of electrostatic energy on the oscillation frequency; and
mitigating effects of an imbalance of electric charges on a tuning capacitance of the VCO signal established by the capacitance circuitry by regulating the supplied direct-current power and providing a regulated supply voltage at a power supply node for powering the VCO signal, where the VCO signal is generated using an electronic oscillator, the method including connecting power to the electronic oscillator with the direct-current power supply and enabling the regulated supply voltage in response to an indication that the integrated circuit is to execute an application requiring stability of the oscillating frequency within a particular threshold.

14. The method of claim 13, wherein the VCO signal is generated using an electronic oscillator, the method including connecting power to the electronic oscillator with the direct-current power supply and disabling the regulated supply voltage in response to an indication that the integrated circuit is to execute an application that does not require stability of the oscillating frequency within the particular threshold.

15. The method of claim 13, wherein the application includes the use of an ultrahigh frequency system, a radio frequency system, or an ultra wideband radio frequency system.

* * * * *